(12) United States Patent
Yamagishi et al.

(10) Patent No.: US 6,928,602 B2
(45) Date of Patent: Aug. 9, 2005

(54) ENCODING METHOD AND ENCODER

(75) Inventors: Hiroyuki Yamagishi, Tokyo (JP);
Yoshihide Shimpuku, Kanagawa (JP)

(73) Assignee: Sony Corporation, Tokyo (JP)

( * ) Notice: Subject to any disclaimer, the term of this patent is extended or adjusted under 35 U.S.C. 154(b) by 417 days.

(21) Appl. No.: 10/196,839

(22) Filed: Jul. 16, 2002

(65) Prior Publication Data

US 2003/0079172 A1 Apr. 24, 2003

(30) Foreign Application Priority Data

Jul. 18, 2001 (JP) .................................. P2001-218111

(51) Int. Cl.[7] ............................................. H03M 13/00
(52) U.S. Cl. ..................................................... 714/781
(58) Field of Search ........................................ 714/781

(56) References Cited

U.S. PATENT DOCUMENTS 3,811,108 A * 5/1974 Howell ....................... 714/785
6,058,500 A * 5/2000 DesJardins et al. ......... 714/781
6,170,076 B1 * 1/2001 Kim ........................... 714/786
6,219,815 B1 * 4/2001 DesJardins et al. ......... 714/781

* cited by examiner

Primary Examiner—Joseph D. Torres
(74) Attorney, Agent, or Firm—Jay H. Maioli

(57) ABSTRACT

An encoding method for encoding information bits into a codeword by a linear code is provided. The information bits appear in the codeword as a part of the codeword. The linear code is a code in which a codeword resulting from cyclically shifting an arbitrary codeword by p bit positions is also a codeword. A code polynomial having the codeword in which the information bits appear as a part thereof is computed by executing an arithmetic operation of p polynomials $G_0(x), \ldots, G_{p-1}(x)$ and a polynomial having the information bits as coefficients. Accordingly, a quasi-cyclic (QC) code can be encoded by only polynomial operations, and an encoder can be simplified.

10 Claims, 6 Drawing Sheets

ENCODING METHOD AND ENCODER

BACKGROUND OF THE INVENTION

1. Field of the Invention

The present invention relates to encoding methods and encoders for information bits used in, for example, recording and transmission.

2. Description of the Related Art

A linear code C of degree k having a code length n can be encoded by the product of a generator matrix G and information bits c. When the linear code C is a systematic code, parity bits can be generated by the product of a parity generator matrix P and the information bits c. Generally, the size of the parity generator matrix P is (n−k)×k. If the code rate r=k/n is constant, the parity generator matrix P increases in size in proportion to the square of the code length n.

When the linear code C is a cyclic code, the systematic code can be easily encoded by polynomial operations. In other words, for example, the product of a polynomial M(x) having information bits as coefficients and $x^{n-k}$ is divided by a generator polynomial G(x), and the remainder is obtained. As a result, parity bits can be computed. An encoder can be implemented by using a feedback shift register. It is unnecessary to prepare a parity generator matrix.

In the linear code C, if a codeword resulting from cyclically shifting an arbitrary codeword by p bit positions is also a codeword of the linear code C, the linear code C is referred to as a quasi-cyclic (QC) code. Since a QC code when p=1 is a cyclic code, the QC code can be encoded by a generator polynomial. In contrast, generally a QC code when p≠1 cannot be treated as a normal cyclic code. Thus, the QC code is required to be encoded by the generator matrix G or the parity generator matrix P. The longer the code length is, the larger the generator matrix becomes. As a result, the encoder requires a high-capacity ROM.

For the encoding of cyclic codes using polynomial operations, please refer to "Error Control Coding: Fundamentals and Applications" by Shu Lin and Daniel J. Costello, Jr. (Prentice-Hall, 1983).

SUMMARY OF THE INVENTION

As described above, when the generator matrix is used to encode the QC code, the longer the code length is, the larger the generator matrix becomes. As a result, the encoder becomes large. In LDPC (Low-Density Parity Check) codes and turbo codes, it is known that characteristics near the Shannon limit can be achieved by increasing the code length. If the QC code is applied to LDPC codes and turbo codes, the foregoing problem with the known QC code becomes bothersome.

In order to solve the foregoing problems, it is an object of the present invention to provide an encoding method and an encoder for being able to encode a QC code by only performing polynomial operations so that the encoder can be simplified.

According to an aspect of the present invention, the foregoing objects are achieved through provision of an encoding method for encoding information bits by adding parity bits to the information bits. The encoding method includes a step of computing the parity bits by executing an arithmetic operation of a polynomial having coefficients, at least some of which are formed by the information bits, and h generator polynomials $G_0(x), \ldots, G_{h-1}(x)$ where h is an integer greater than or equal to 2.

For example, according to the aspect of the present invention, parity bits can be obtained as the final remainder by a quasi-division operation using a plurality of generator polynomials. The quasi-division operation uses one generator polynomial as a divisor to compute the quotient of order (hk−1); the quasi-division operation uses another generator polynomial as a divisor to compute the quotient of order (hk−2); ...; the quasi-division operation uses yet another generator polynomial as a divisor to polynomial as a divisor to compute the quotient of order h(k−1). In other words, the quasi-division operation uses a plurality of generator polynomials as divisors by switching from one generator operator to another and performs quasi-division calculations. According to the present invention, it is preferable to use a plurality of generator polynomials each having a different highest degree. As is generally known, division of a polynomial having binary data as its coefficients can be substantially performed by sequentially performing quasi-subtraction/addition operations using divisors. According to the present invention, such a method can be applied to parity computation. When a code is represented as a polynomial, permutation of the order of information bit strings, code strings, or symbols in information bit vectors allows the relationship between orders and coefficients of the polynomial to be easily transformed. If the transformed configuration includes the configuration described in this aspect of the present invention, it is understood that the transformed configuration also falls within the scope of the present invention.

According to another aspect of the present invention, an encoder for encoding information bits into a codeword by a linear code is provided. The information bits appear in the codeword as a part of the codeword, and the linear code is a code in which a codeword resulting from cyclically shifting an arbitrary codeword by p bit positions is also a codeword. The encoder includes a parity generator for generating parity bits by executing an arithmetic operation of p polynomials $G_0(x), \ldots, G_{p-1}(x)$ and a polynomial having the information bits as coefficients; and a concatenation unit for concatenating the parity bits, which are generated by the parity generator, and the information bits to generate the code polynomial.

In the encoding method, for each i, one generator polynomial $G_i(X)$ may be selected from code polynomials; the degree of the selected polynomial $G_i(X)$ may be the smallest in all candidate polynomials, each of which is a polynomial having i as the remainder of the degree of the candidate polynomial divided by p, where p is the number of generator polynomials $G_i(X)$ i=0, 1, ..., (p−1);

each of the code polynomials is represented by $$\sum_{i=0}^{p-1} Q_i(x^p)G_i(x); \text{ and} \quad (1)$$

coefficients of $x^j$ of the code polynomials may be information bits, and the other coefficients of the code polynomials may be parity bits, where $j \geq m_{j \bmod p}$ $m_i$ is the degree of the selected polynomial $G_i(X)$.

Noted that, a code polynomial is one of candidate polynomial if the degree of the code polynomial is divided by p and the remainder of that division is i, thus the generation polynomial $G_i(X)$ may be regarded as the polynomial selected from the group of candidate polynomials for i.

In the encoding method, for each i, one generator polynomial $G_i(X)$ may be selected from code polynomials; r of the selected polynomial $G_i(X)$ may be the largest in all candidate polynomials, each of which is divisible by $x^r$ but not by $x^{r+1}$, and each of which has i as the remainder of r divided by p, where p is the number of generator polynomials $G_i(X)$ i=0, 1, . . . , (p−1);

each generator polynomial $G_i(X)$ may be divisible by $x^{r_i}$ but not by $x^{r_i+1}$;

each of the code polynomials may be represented by $$\sum_{i=0}^{p-1} Q_i(x^{-p})G_i(x); \text{ and} \quad (2)$$

coefficients of $x^j$ of the code polynomials may be information bits, and the other coefficients of the code polynomials may be parity bits, where $j \leq r_{j \bmod p}$.

By performing the encoding using the foregoing method, a generator matrix and a parity generator matrix are no longer necessary. A QC code can be encoded by h or p polynomials in a more simplified manner. When an encoder for QC codes is to be incorporated, even if the code length becomes larger, a large-capacity ROM corresponding to a parity generator matrix is unnecessary. Thus, the encoder can be simplified.

DESCRIPTION OF THE PREFERRED EMBODIMENTS

With reference to the accompanying drawings, the present invention will become clear from the following description of embodiments of the present invention.

1. First Embodiment

An encoding method according to a first embodiment of the present invention will now be described.

p generator polynomials having elements of GF(q) as coefficients are represented by $G_0(x), \ldots, G_{p-1}(x)$, and the degrees of the polynomials are represented by $m_0, \ldots, m_{p-1}$. The degrees of these polynomials are such that $m_i \bmod p = i$ (wherein A mod B indicates the remainder of A divided by B), and these polynomials are monic. When a polynomial is monic, in terms of a corresponding information bit vector or code vector, a symbol corresponding to a coefficient of higher order is "0".

A polynomial A(x) having information bits as coefficients is defined as:

$$A(x) = a_{n-1}X^{n-1} + \ldots a_1x + a_0 (a_i \in GF(q)) \quad (3)$$

where $a_i = 0$ (i<$m_i$ mod p)

An arbitrary A(x) can be represented as a sum using the generator polynomials $G_0(x), \ldots, G_{p-1}(x)$:

$$A(x) = W(x) + R(x) \quad (4)$$

$$W(x) = \sum_{i=0}^{p-1} Q_i(x^p)G_i(x)$$

$$R(x) = \sum_{i=0}^{p-1} R_i(x^p)x_i$$

where $Q_i(x^p)$ and $R_i(x^p)$ are polynomials of $x^p$ having elements of GF(q) as coefficients, W(x) is a polynomial of degree n−1 or less, and R(x) satisfies the condition deg[$R_i(x^p)x^i$]<$m_i$ (deg[F(x)] indicates the degree of a polynomial F(x)).

Figure 6:
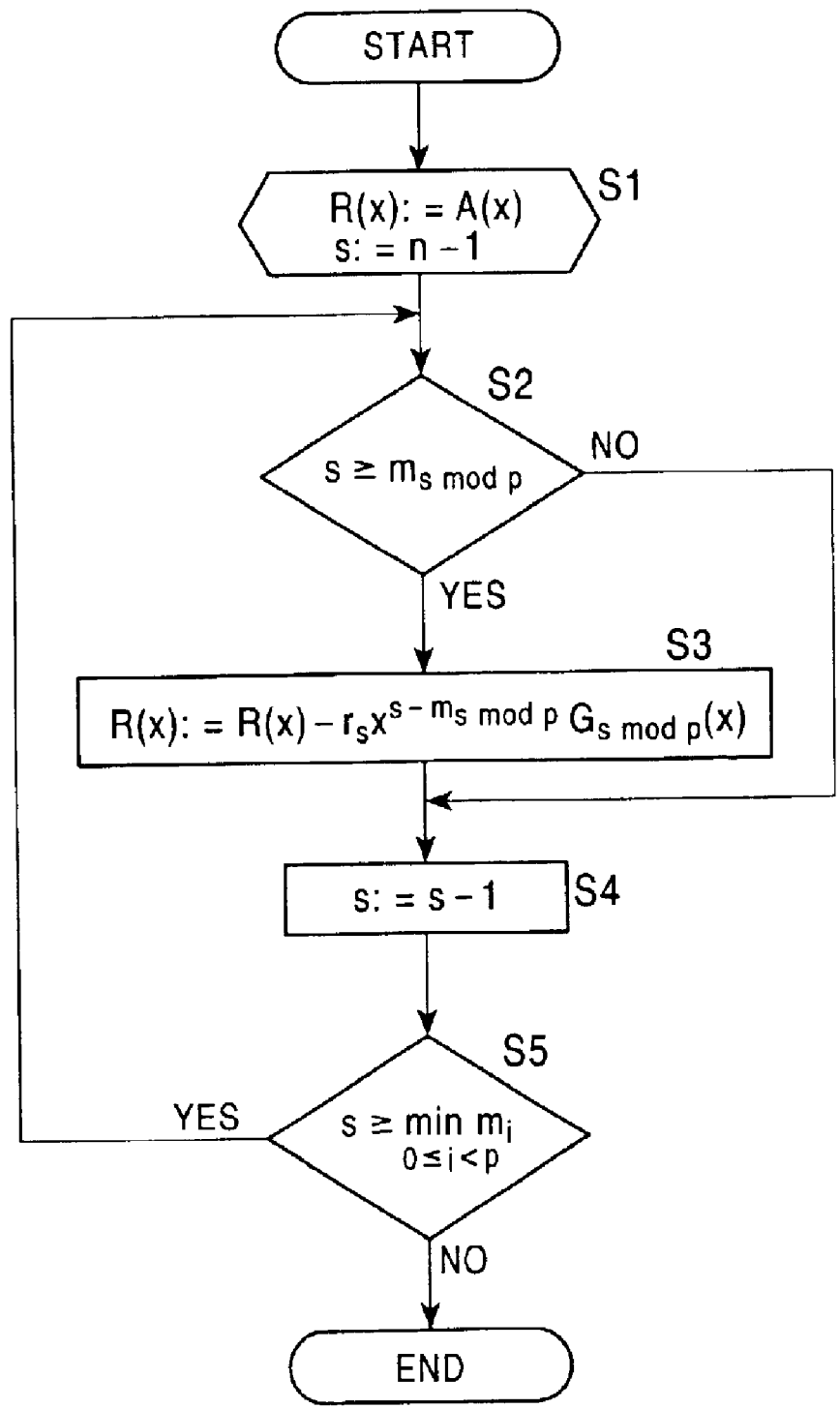
FIG. 6 is a flowchart showing an encoding method according to the present invention.

Referring to FIG. 6, the parity polynomial R(x) can be computed by the following procedure:

1. R(x)←A(x) and s←n−1 (step S1)
2. If s≧$m_{s \bmod p}$ (step S2), then a coefficient of $x^s$ in R(x) is $r_s$, R(x)←R(x)−$r_s x^{s-m_s \bmod p} G_{s \bmod p}(x)$ (step S3)
3. s←s−1 (step S4)

If s≧min $m_i$ (0≦i<p), go to 2.

If s<min $m_i$, go to 4 (step S5).
4. End.

In the above procedure, s is a target order in the arithmetic operation. If A(x) has some of its coefficients corresponding to information bits while the other coefficients corresponding to parity bits, A(x) is a code polynomial W(x).

Using R(x) computed by the above procedure, W(x)=A(x)−R(x) is calculated.

A linear code having W(x) as a code polynomial is encoded as a systematic code in which information bits appear as a part of the code. In order to encode the linear code by the above procedure, no generator matrix or parity generator matrix is necessary. The linear code can be encoded by using p polynomials.

For example, when GF(2), p=3, $G_0(x)=x^9+x^3+x^2+x$, $G_1(x)=x^4+x^3+x$, and $G_2(x)=x^8+x^6+1$, a binary code with a code length n=21 is encoded. When information bits are ($a_{20}, a_{19}, a_{18}, a_{17}, a_{16}, a_{15}, a_{14}, a_{13}, a_{12}, a_{11}, a_{10}, a_9, a_8, a_7, a_4$), we have A(x)=$a_{20}x^{20}+a_{19}x^{19}+a_{18}x^{18}+a_{17}x^{17}+a_{16}x^{16}+a_{15}x^{15}+a_{14}x^{14}+a_{13}x^{13}+a_{12}x^{12}+a_{11}x^{11}+a_{10}x^{10}+a_9x^9+a_8x^8+a_7x^7+a_4x^4$. With the above procedure, we have R(x)=$r_6x^6+r_5x^5+r_3x^3+r_2x^2+r_1x+r_0$. Thus, W(x) can be encoded as W(x)=$a_{20}x^{20}+a_{19}x^{19}+a_{18}x^{18}+a_{17}x^{17}+a_{16}x^{16}+a_{15}x^{15}+a_{14}x^{14}+a_{13}x^{13}+a_{12}x^{12}+a_{11}x^{11}+a_{10}x^{10}+a_9x^9+a_8x^8+a_7x^7-r_6x^6-r_5x^5+a_4x^4-r_3x^3-r_2x^2-r_1x-r_0$. A code having W(x) as a code polynomial is a systematic code, namely, a QC code when p=3.

In order to encode information bits (1,1,1,1,1,1,1,1,1,1,1, 1,1,1,1), processing steps for computing R(x) are described below in which coefficients are arranged in descending order of orders of x:

| | | | | | | | | | | | | | | | | | | | | |
|---|---|---|---|---|---|---|---|---|---|---|---|---|---|---|---|---|---|---|---|---|
| s = 20 | 1 | 1 | 1 | 1 | 1 | 1 | 1 | 1 | 1 | 1 | 1 | 1 | 1 | 1 | 0 | 0 | 1 | 0 | 0 | 0 | 0 |
| s = 19 | | 1 | 0 | 1 | 1 | 1 | 1 | 1 | 0 | 1 | 1 | 1 | 1 | 1 | 0 | 0 | 1 | 0 | 0 | 0 | 0 |
| s = 18 | | | 1 | 1 | 0 | 1 | 1 | 1 | 0 | 1 | 1 | 1 | 1 | 1 | 0 | 0 | 1 | 0 | 0 | 0 | 0 |
| s = 17 | | | | 1 | 0 | 1 | 1 | 1 | 1 | 0 | 0 | 1 | 1 | 1 | 0 | 0 | 1 | 0 | 0 | 0 | 0 |
| s = 14 | | | | | | | 1 | 1 | 1 | 0 | 0 | 0 | 1 | 1 | 0 | 0 | 1 | 0 | 0 | 0 | 0 |
| s = 13 | | | | | | | | 1 | 0 | 0 | 0 | 0 | 1 | 1 | 1 | 0 | 1 | 0 | 0 | 0 | 0 |
| s = 12 | | | | | | | | | 1 | 0 | 1 | 0 | 1 | 1 | 1 | 0 | 1 | 0 | 0 | 0 | 0 |
| s = 10 | | | | | | | | | | | 1 | 0 | 1 | 1 | 0 | 1 | 0 | 0 | 0 | 0 | 0 |
| s = 9 | | | | | | | | | | | | 1 | 1 | 0 | 0 | 1 | 0 | 0 | 0 | 0 | 0 |
| s = 8 | | | | | | | | | | | | | 1 | 0 | 0 | 1 | 0 | 1 | 1 | 1 | 0 |
| s = 6 | | | | | | | | | | | | | | | 1 | 1 | 0 | 1 | 1 | 1 | 1 |

Finally, we have $R(x)=x^6+x^5+x^3+x^2+x+1$ and the coded $W(x)=x^{20}+x^{19}+x^{18}+x^{17}+x^{16}+x^{15}+x^{14}+x^{13}+x^{12}+x^{11}+x^{10}+x^9+x^8+x^7+x^6+x^5+x^4+x^3+x^2+x+1$.

When p polynomials can be represented as:

$$x^n - 1 = \sum_{i=0}^{p-1} Q_1(x^p) G_i(x) \quad (5)$$

then, codes obtainable by the above polynomials are QC codes. In the foregoing example, a QC code can be encoded by an arithmetic operation of a polynomial having information bits as coefficients and p polynomials. Table 1 shows examples of parameters of a binary QC code:

TABLE 1

| Code length n | Dimension k | Parameter p of QC code |
|---|---|---|
| 21 | 15 | 3 |
| 315 | 265 | 5 |
| 4599 | 4227 | 9 |
| 5355 | 5121 | 21 |

Figure 1:
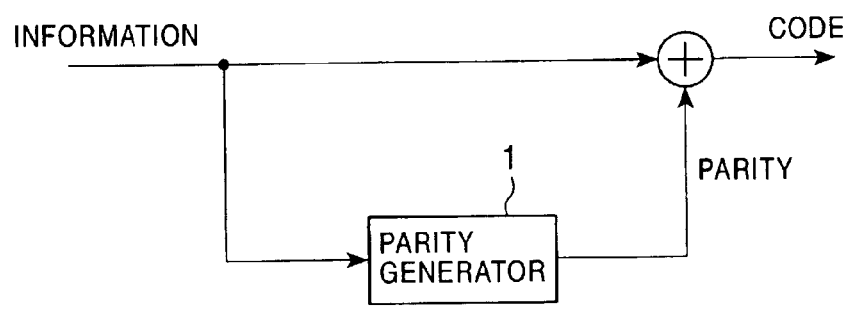
FIG. 1 is a block diagram showing the configuration of an encoder for a systematic code.

FIG. 1 shows the configuration of an encoder for a systematic code. As shown in FIG. 1, the encoder has a parity generator 1 for receiving information bits and outputting parity bits. Parity bits generated by the parity generator 1 are concatenated with the information bits, and hence the result is output as a code.

Figure 2:
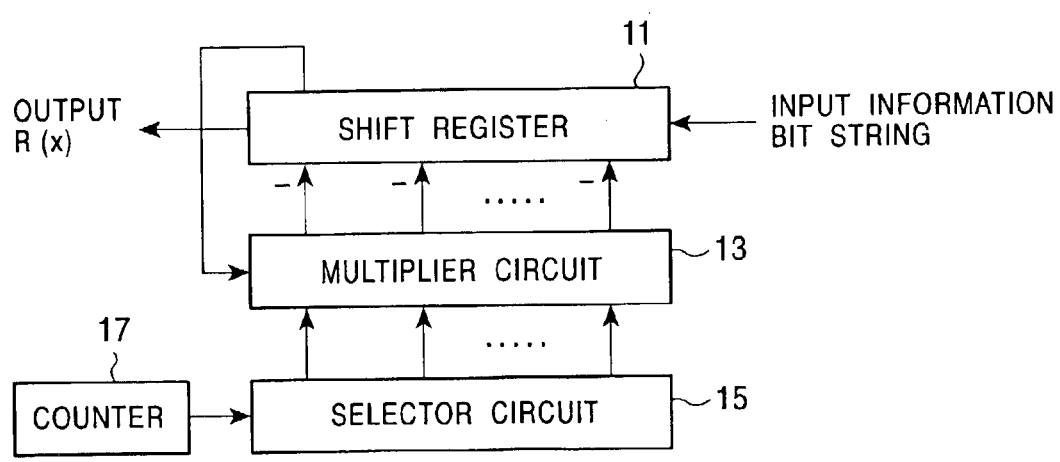
FIG. 2 is a block diagram showing the configuration of a parity generator in the encoder according to the present invention.

FIG. 2 shows an example of the configuration of the parity generator 1. Parity bits can be computed by computing $-R(x)$. The parity generator 1 shown in FIG. 2 computes $R(x)$ by receiving information bits one at a time and sequentially performing calculations.

The parity generator 1 in this example has a shift register 11, a multiplier circuit 13, a selector circuit 15, and a counter 17. Information bits are sequentially input to the shift register 11 in descending order of orders of coefficients of $A(x)$. The multiplier circuit 13 multiplies a polynomial selected by the selector circuit 15 by a value at a specific position in the shift register 11. The product is subtracted from the value of the shift register 11, thus shifting the value. By repeating the above operation, the coefficients of $R(x)$ are output one after another from the shift register 11.

The selector circuit 15 selects, in every time period, a value corresponding to the p polynomials or 0 in accordance with a value of the counter 17 indicating the number of bits input to the shift register 11. For a binary code, the multiplier circuit 13 can be implemented by an AND gate, and a subtracter circuit (not shown) can be implemented by an XOR gate.

Figure 3:
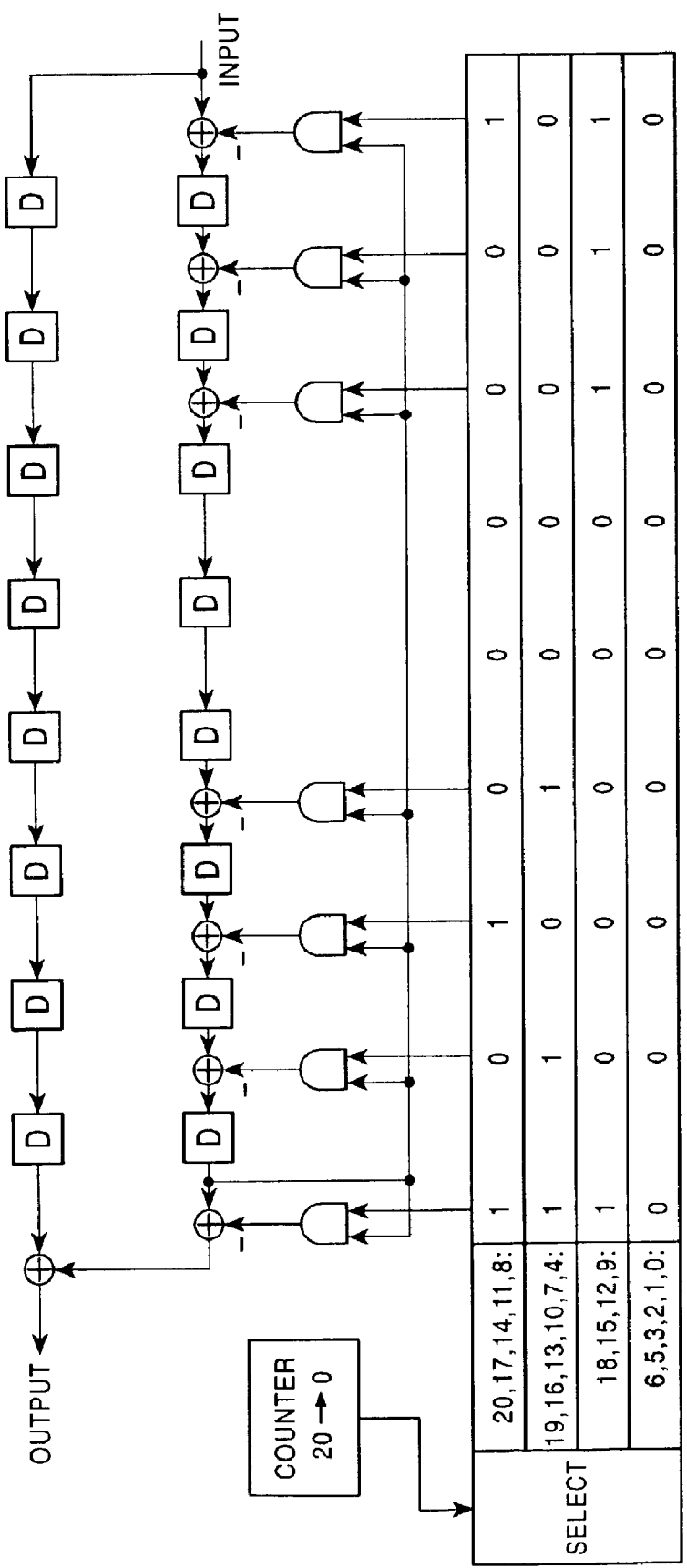
FIG. 3 illustrates a specific example of the configuration of the encoder according to the present invention.

FIG. 3 shows a specific example of an encoder to which the parity generator 1 shown in FIG. 2 is applied. The encoder encodes a binary QC code (21, 15) when p=3, $G_0(x)=x^9+x^3+x^2+x$, $G_1(x)=x^4+x^3+x$, and $G_2(x)=x^8+x^6+1$.

In this encoder, when coefficients of $A(x)$ are sequentially input to the right side of a shift register in descending order of orders, coefficients of the encoded code polynomial $W(x)$ are sequentially output from the left side of the shift register in descending order of orders. The shift register includes two stages, namely, upper and lower stages. The upper stage of the shift register delays information bits of $A(x)$, whereas the lower stage computes parity bits.

The flow of signals will now be described step by step.

Prior to performing encoding, the contents of the shift register are initialized to zero; the value of a counter is set to $s \leftarrow 20$; and coefficients of $A(x)$ are input to the shift register sequentially. When values ($a_{20}, a_{19}, a_{18}, a_{17}, a_{16}, a_{15}, a_{14}, a_{13}$) are stored in the upper stage of the shift register, the same values are also stored in the lower stage of the shift register. These values can be regarded as coefficients $r_{20}$ to $r_{13}$ of $R(x)$ when s=20 in the above-described procedure.

The value $(1,0,1,0,0,0,0,0,1)$ that is selected by a selector circuit when s=20 corresponds to $x^{12}G_2(x)$. This value $(1,0,1,0,0,0,0,0,1)$ is multiplied by the value $r_{20}$ by an AND circuit, and the product is subtracted from $r_{20}x^{20}+r_{19}x^{19}+r_{18}x^{18}+r_{17}x^{17}+r_{16}x^{16}+r_{15}x^{15}+r_{14}x^{14}+r_{13}x^{13}+r_{12}x^{12}$ by an XOR circuit. As a result, the left end of the lower stage of the shift register outputs $r_{20}+r_{20}=0$, and the circuit outputs $a_{20}+0=a_{20}$. In a subsequent time period, coefficients $r_{19}$ to $r_{12}$ of $R(x) \leftarrow R(x)-r_{20}x^{12}G_2(x)$, which is updated by the second step of the above-described procedure, are input to the lower stage of the shift register, and the value of the counter is updated to $s \leftarrow 19$.

The value $(1,1,0,1,0,0,0,0,0)$ that is selected by the selector circuit when s=19 corresponds to $x^{15}G_1(x)$. This value $(1,1,0,1,0,0,0,0,0)$ is multiplied by the value $r_{19}$ by the AND circuit, and the product is subtracted from $r_{19}x^{19}+r_{18}x^{18}+r_{17}x^{17}+r_{16}x^{16}+r_{15}x^{15}+r_{14}x^{14}+r_{13}x^{13}+r_{12}x^{12}+r_{11}x^{11}$ by the XOR circuit. As a result, the left end of the lower stage of the shift register outputs $r_{19}+r_{19}=0$, and the circuit outputs $a_{19}+0=a_{19}$. In a subsequent time period, coefficients $r_{18}$ to $r_{11}$ of $R(x) \leftarrow R(x)-r_{19}x^{15}G_1(x)$, which is updated by the second step of the above-described procedure, are input to the lower stage of the shift register, and the value of the counter is updated to $s \leftarrow 18$.

The value $(1,0,0,0,0,0,1,1,1)$ that is selected by the selector circuit when s=18 corresponds to $x^9G_0(x)$. This value $(1,0,0,0,0,0,1,1,1)$ is multiplied by the value $r_{18}$ by the AND circuit, and the product is subtracted from $r_{18}x^{18}+r_{17}x^{17}+r_{16}x^{16}+r_{15}x^{15}+r_{14}x^{14}+r_{13}x^{13}+r_{12}x^{12}+r_{11}x^{11}+r_{10}x^{10}$ by the XOR circuit. As a result, the left end of the lower stage of the shift register outputs $r_{18}+r_{18}=0$, and the circuit outputs $a_{18}+0=a_{18}$. In a subsequent time period, coefficients $r_{17}$ to $r_{10}$ of $R(x) \leftarrow R(x)-r_{18}x^9G_1(x)$, which is updated by the second step of the above-described procedure, are input to the lower stage of the shift register, and the value of the counter is updated to $s \leftarrow 17$.

Similar operations are continuously performed, and all terms of zero degree in A(x) are input to the shift register before s=7. Subsequently, zeroes are continuously input.

When s=6, the lower stage of the shift register stores $r_6$ to $r_0$ of R(x) as the first seven digits from the left. Since a coefficient of the sixth order of A(x) is zero, the circuit outputs parity, i.e., $0+r_6=r_6$. The lower stage of the shift register does not perform subtraction. In a subsequent time period, the values $r_5$ to $r_0$ are input to the first six digits from the left, and the value of the counter is updated to s←5.

Since a coefficient of the fifth order of A(x) is zero, the circuit outputs parity, i.e., $0+r_5=r_5$. The lower stage of the shift register does not perform subtraction. In a subsequent time period, the values $r_4$ to $r_0$ are input to the first five digits from the left, and the value of the counter is updated to s←4.

The value (1,1,0,1,0,0,0,0,0) that is selected by the selector circuit when s=4 corresponds to $G_1(x)$. This value (1,1,0,1,0,0,0,0,0) is multiplied by the value $r_4$ by the AND circuit, and the product is subtracted from $r_4x^4+r_3x^3+r_2x^2+r_1x^1+r_0$ by the XOR circuit. As a result, the left end of the lower stage of the shift register outputs $r_4+r_4=0$, and the circuit outputs $a_4+0=a_4$. In a subsequent time period, coefficients $r_3$ to $r_0$ of $R(x)\leftarrow R(x)-r_4G_1(x)$, which is updated by the second step of the above-described procedure, are input to the first four digits from the left of the lower stage of the shift register, and the value of the counter is updated to s←3.

Since a coefficient of the third order of A(x) is zero, the circuit outputs parity, i.e., $0+r_3=r_3$. The lower stage of the shift register does not perform subtraction. In a subsequent time period, the values $r_2$ to $r_0$ are input to the first three digits from the left, and the value of the counter is updated to s←2.

Since a coefficient of the second order of A(x) is zero, the circuit outputs parity, i.e., $0+r_2=r_2$. The lower stage of the shift register does not perform subtraction. In a subsequent time period, the values $r_1$ and $r_0$ are input to the first two digits from the left, and the value of the counter is updated to s←1.

Since a coefficient of the first order of A(x) is zero, the circuit outputs parity, i.e., $0+r_1=r_1$. The lower stage of the shift register does not perform subtraction. In a subsequent time period, the value $r_0$ is input to the first digit from the left, and the value of the counter is updated to s←0.

Since a coefficient of the zeroth order of A(x) is zero, the circuit outputs parity, i.e., $0+r_0=r_0$.

The encoding is performed in accordance with the foregoing flow of signals.

Figure 4:
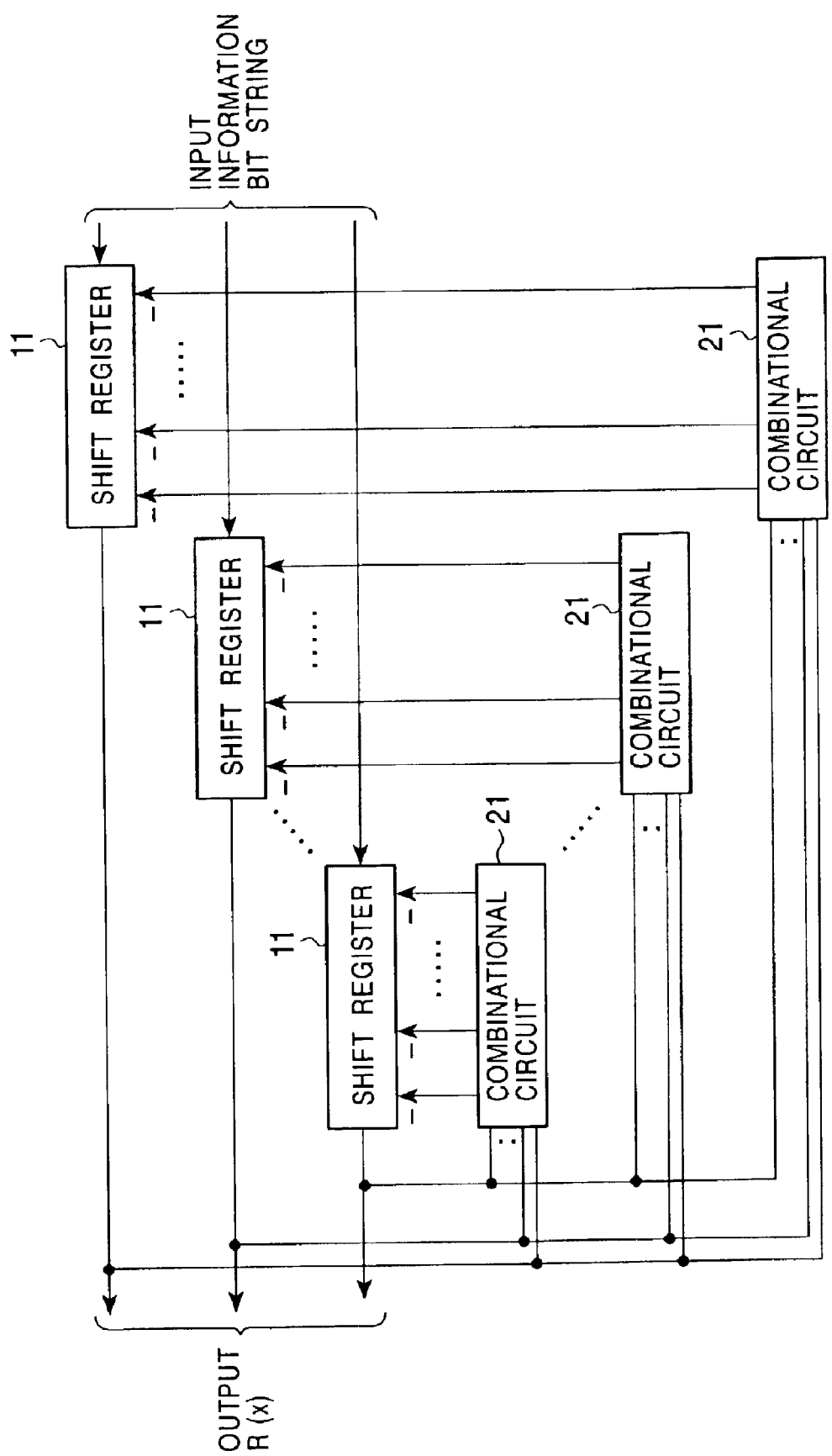
FIG. 4 is a block diagram showing the configuration of the parity generator for generating parity bits by receiving a plurality of information bits according to the present invention.

FIG. 4 shows an example of a device for simultaneously receiving p information bits or a multiple of p information bits, where p is the number of polynomials, and for computing R(x). In this case, the device does not have a counter indicating the number of input bits, and a selector circuit and a multiplier circuit can be implemented by a combinational circuit 21.

In order to compute parity bits using the configuration shown in FIG. 2, coefficients of a polynomial A(x) are input one at a time (one in each time period). With the foregoing procedure, a cycle of the second and third steps corresponds to the operation performed in each time period. Thus, the value s is incremented by one every time period. In the second step, the generator polynomial $G_{s\,mod\,p}(x)$ multiplied by $r_s x^{s-m}{}_{s\,mod\,p}$ is switched every time period in accordance with the value s. Thus, a counter for managing time periods and a selector circuit for selecting a polynomial are necessary.

In contrast, with the configuration shown in FIG. 4, an arithmetic operation corresponding to p cycles of the foregoing procedure or a multiple of p cycles is simultaneously performed in each time period. In particular, when a code has a codeword whose first portion corresponds to information bits and latter portion corresponds to parity bits, and when the number of information bits k or the number of parity bits (n−k) is a multiple of p, batch processing makes it possible not to switch form one generator polynomial to another. As a result, the device can be simplified, and the time required to perform encoding can be reduced.

Figure 5:
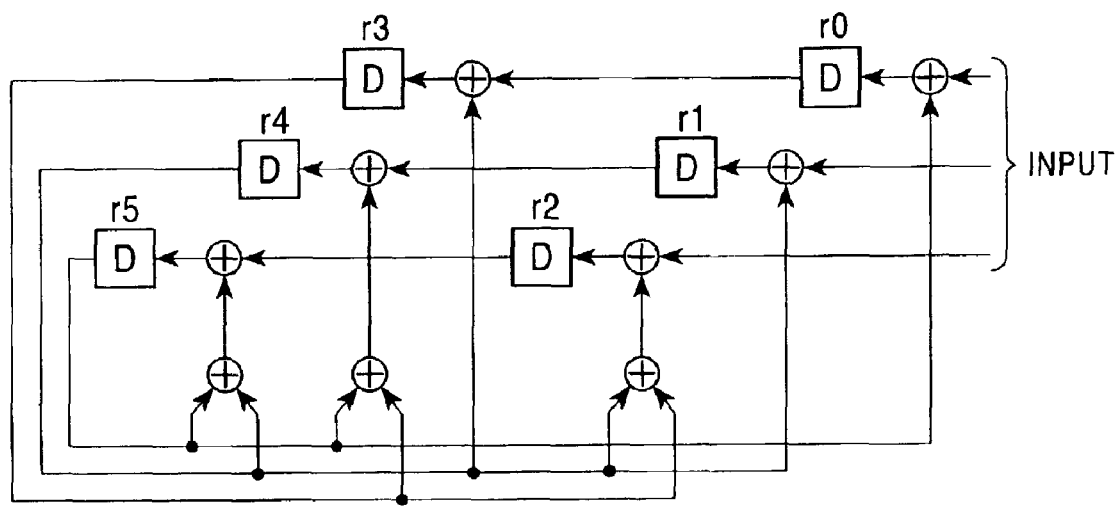
FIG. 5 illustrates the specific configuration of the parity generator for generating parity bits by receiving a plurality of information bits.

FIG. 5 shows a specific example of the parity generator 1 shown in FIG. 4. The parity generator 1 computes parity bits of a binary QC code (21, 15) when p=3, $G_0(x)=x^6+x^4+x^2$, $G_1(x)=x^7+x^5+x^3+x^2+x$, and $G_2(x)=x^8+x^5+x^4+1$. When an information bit string $A(x)=a_{20}x^{20}+a_{19}x^{19}+a_{18}x^{18}+a_{17}x^{17}+a_{16}x^{16}+a_{15}x^{15}+a_{14}x^{14}+a_{13}x^{13}+a_{12}x^{12}+a_{11}x^{11}+a_{10}x^{10}+a_9x^9+a_8x^8+a_7x^7+a_6x^6$ is input, we have a code polynomial $W(x)=a_{20}x^{20}+a_{19}x^{19}+a_{18}x^{18}+a_{17}x^{17}+a_{16}x^{16}+a_{15}x^{15}+a_{14}x^{14}+a_{13}x^{13}+a_{12}x^{12}+a_{11}x^{11}+a_{10}x^{10}+a_9x^9+a_8x^8+a_7x^7+a_6x^6-r_5x^5+r_4x^4-r_3x^3-r_2x^2-r_1x-r_0$.

When information bits are input to the shift register in descending order of orders of coefficients of A(x) in units of three, after all bits of A(x) are processed, the shift register can compute R(x).

Hereinafter the flow of signals will now be described step by step.

Prior to performing encoding, the contents of the shift register are initialized to zero.

The coefficients of A(x) are input to a lower stage, a middle stage, and an upper stage in units of three in descending order of orders of coefficients of A(x).

After two time periods have passed since the start of inputting, the shift register stores values ($a_{20}$, $a_{19}$, $a_{18}$, $a_{17}$, $a_{16}$, $a_{15}$). These values ($a_{20}$, $a_{19}$, $a_{18}$, $a_{17}$, $a_{16}$, $a_{15}$) can be regarded as coefficients $r_{20}$ to $r_{15}$ of R(x) when s=20 in the above-described procedure.

Since coefficients of the sixth and seventh order of $G_2(x)$ and a coefficient of the sixth order of $G_1(x)$ are zeroes, after three cycles, we have R(x) as follows:

$$R(x) \leftarrow R(x) - r_{20}x^{12}G_2$$
$$(x) - r_{19}x^{12}G_1(x) - r_{18}x^{12}G_0$$
$$x) = R(x) - r_{20}(x^{20} + x^{17} +$$
$$x^{16} + x^{12}) - r_{19}(x^{19} + x^{17} + x^{15} +$$
$$x^{14} + x^{13}) - r_{18}(x^{18} + x^{16} + x^{14}) = R$$
$$(x) - r_{20}x^{20} - r_{19}x^{19} - r_{18}$$
$$x^{18} - (r_{20} + r_{19})x^{17} -$$
$$(r_{20} + r_{18})x^{16} - r_{19}x^{15} -$$
$$(r_{19} + r_{18})x^{14} - r_{19}x^{13} - r_{20}x^{12}. \tag{6}$$

The arithmetic operation can be performed by an XOR combinational circuit for the leftmost bits $r_{20}$ to $r_{18}$ at each stage of the shift register and an XOR circuit corresponding to subtraction.

As a result of the arithmetic operation, values stored in the shift register can be regarded as coefficients $r_{17}$ to $r_{12}$ of R(x) when s=17.

Similar operations are continuously performed for four time periods, and finally the shift register computes values $r_5$ to $r_0$.

2. Second Embodiment

An encoding method according to a second embodiment of the present invention will now be described.

P generator polynomials having elements of GF(q) as coefficients are represented by $G_0(x), \ldots, G_{p-1}(x)$. For $r_i$, these polynomials $G_i(x)$ are divisible by $x^{r_i}$, but not by $x^{r_i+1}$. In these polynomials $G_i(x)$, $r_i$ mod $p=i$, and a coefficient of $x^{r_i}$ is 1.

A polynomial $A(x)$ having information bits as coefficients may be defined as:

$$A(x) = a_{n-1}X^{n-1} + \ldots a_1 x + a_0 (a_i \in GF(q)) \quad (7)$$

where $a_i = 0$ $(i > r_{i \bmod p})$

An arbitrary $A(x)$ can be represented as a sum using $G_0(x), \ldots, G_{p-1}(x)$:

$$A(x) = W(x) + U(x) \quad (8)$$

$$W(x) = \sum_{i=0}^{p-1} Q_i(x^{-p}) G_i(x)$$

$$U(x) = \sum_{i=0}^{p-1} U_i(x^{-p}) x^{n-p+i}$$

where $Q_i(x^{-p})$ and $U_i(x^{-p})$ are polynomials of $x^{-p}$ having elements of GF(q) as coefficients, $W(x)$ is a polynomial of $n-1$ degree or less, and, in $U(x)$, each $U_i(x^{-p})x^{n-p+i}$ is divisible by $x^{r_i+p}$.

Figure 7:
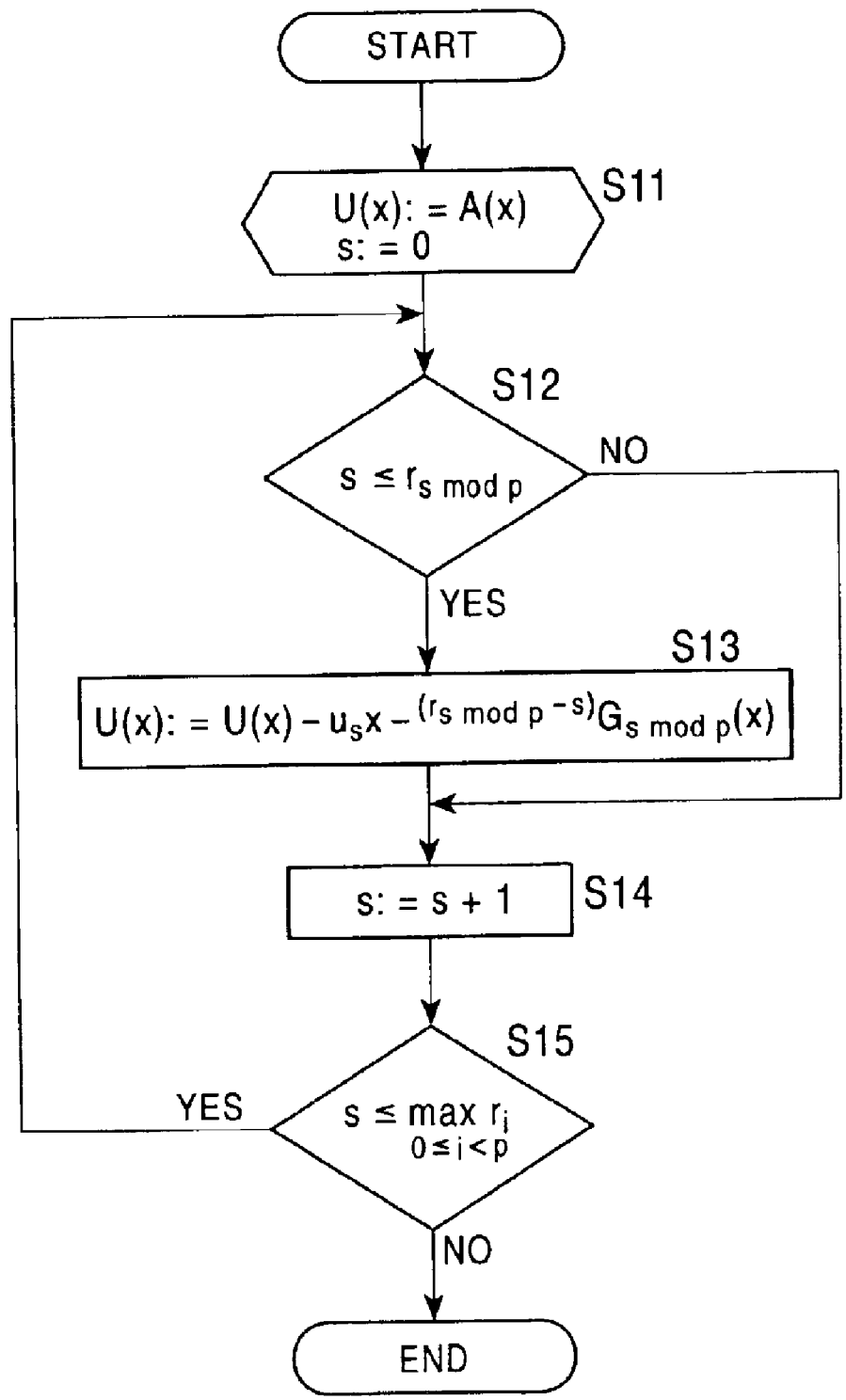
FIG. 7 is a flowchart showing another encoding method according to the present invention.

Referring to FIG. 7, the polynomial $U(x)$ can be computed as follows:
1. $U(x) \leftarrow A(x)$ and $s \leftarrow 0$ (step S11)
2. If $s \leq r_{s \bmod p}$ (step S12), then a coefficient of $x^s$ in $U(x)$ is $u_s$, and
$U(x) \leftarrow U(x) - u_s x^{-(r_s \bmod p - s)} G_{s \bmod p}(x)$ (step S13)
3. $s \leftarrow s+1$ (step S14)

If $s \leq \max r_i$ $(0 \leq i < p)$ (step S15), go to 2.

If $s > \max r_i$, go to 4.
4. End

Using $U(x)$, $W(x) = A(x) - U(x)$ is calculated.

A linear code having $W(x)$ as a code polynomial is encoded as a systematic code in which information bits appear as a part of the code. When encoding is performed by the above-described procedure, no generator matrix or parity generator matrix is necessary. Encoding can be performed by only p polynomials.

For example, when GF(2), p=3, $G_0(x)=x^{20}+x^{18}+x^{12}$, $G_1(x)=x^{19}+x^{18}+x^{16}$, and $G_2(x)=x^{19}+x^{15}+x^{11}$, a binary code with a code length n=21 is encoded. When information bits are $(a_{16}, a_{13}, a_{12}, a_{11}, a_{10}, a_9, a_8, a_7, a_6, a_5, a_4, a_3, a_2, a_1, a_0)$, we have $A(x)=a_{16}x^{16}+a_{13}x^{13}+a_{12}x^{12}+a_{11}x^{11}+a_{10}x^{10}+a_9x^9+a_8x^8+a_7x^7+a_6x^6+a_5x^5+a_4x^4+a_3x^3+a_2x^2+a_1x^1+a_0$. In accordance with the above procedure, $U(x)=u_{20}x^{20}+u_{19}x^{19}+u_{18}x^{18}+u_{17}x^{17}+u_{15}x^{15}+u_{14}x^{14}$ is calculated. $W(x)$ can be encoded as: $W(x)=-u_{20}x^{20}-u_{19}x^{19}-u_{18}x^{18}-u_{17}x^{17}+a_{16}x^{16}-u_{15}x^{15}-u_{14}x^{14}+a_{13}x^{13}+a_{12}x^{12}+a_{11}x^{11}+a_{10}x^{10}+a_9x^9+a_8x^8+a_7x^7+a_6x^6+a_5x^5+a_4x^4+a_3x^3+a_2x^2+a_1x^1+a_0$. A code having $W(x)$ as a code polynomial is a systematic code, namely, a QC code when p=3.

In order to encode information bits (1,1,1,1,1,1,1,1,1,1,1,1,1,1,1), processing steps for computing $U(x)$ are described below in which coefficients are arranged in descending order of orders of x:

| | |
|---|---|
| s = 0 | 000010011111111111111 |
| s = 1 | 00001001111101011111 |
| s = 2 | 0000100111110101001 |
| s = 5 | 00001001110101111 |
| s = 6 | 000010001100011 |
| s = 7 | 000010100010001 |
| s = 9 | 000010100111 |
| s = 10 | 00011110011 |
| s = 11 | 0001111111 |
| s = 12 | 010110111 |
| s = 13 | 11111011 |
| s = 14 | 1111011 |

Finally, we have $U(x)=x^{20}+x^{19}+x^{18}+x^{17}+x^{15}+x^{14}$, and the coded $W(x)=x^{20}+x^{19}+x^{18}+x^{17}+x^{16}+x^{15}+x^{14}+x^{13}+x^{12}+x^{11}+x^{10}+x^9+x^8+x^7+x^6+x^5+x^4+x^3+x^2+x+1$.

The entire disclosure of Japanese Patent Application No. 2001-218111 filed on Jul. 18, 2001, Japanese Patent Application No. 2002-174922 filed on Jun. 14, 2001, or Japanese Patent Application No. 2002-184868 filed on Jun. 25, 2001 including specification, claims, drawings, and summary is incorporated herein by reference in its entirety.

What is claimed is:

1. An encoding method for encoding a signal having information bits by adding parity bits to the information bits, comprising:
   a step of computing the parity bits by executing quasi-division operations using a polynomial having coefficients as a dividend, at least some of the coefficients being formed by the information bits, and h generator polynomials $G0(x), \ldots, Gh-1(x)$ as divisors, wherein h is an integer greater than or equal to 2; and
   a step of outputting an encoded signal having the computed parity bits concatenated with the information bits.

2. The encoding method according to claim 1, further comprising a step of generating a linear code in which a codeword created by cyclically shifting an arbitrary codeword by p bit positions is also a codeword of the linear code.

3. The encoding method according to claim 2, wherein p is an integer greater than or equal to 2 and is equal to h.

4. The encoding method according to claim 3, wherein
   p is the number of generator polynomials $G_i(X)$
   $i=0, 1, \ldots, (p-1)$;
   for each i, one generator polynomial $G_i(X)$ is selected from code polynomials;
   a degree of the selected polynomial $G_i(X)$ is a smallest in all candidate polynomials, each of which is a polynomial having i as the remainder of the degree of the candidate polynomial divided by p, wherein each of the code polynomials is represented by $$\sum_{i=0}^{p-1} Q_i(x^p) G_i(x); \text{ and} \quad (9)$$

coefficients of $x^j$ of the code polynomials are information bits, and
the other coefficients of the code polynomials are parity bits,
wherein
j is greater than or equal to $m_i$ mod p, and
$m_i$ is the degree of the selected polynomial $G_i(X)$.

5. The encoding method, wherein a codeword created by reversing the order of information bits of an arbitrary codeword generated by an encoding method of claim 4 is also a codeword.

6. The encoding method according to claim 3, wherein
p is the number of generator polynomials $G_i(X)$
i=0, 1, . . . , (p−1);
for each i, one generator polynomial $G_i(X)$ is selected from code polynomials;
a coefficient r of the selected polynomial $G_i(X)$ is the largest in all candidate polynomials, each of which is divisible by $x^r$ but not by $x^{r+1}$, and each of which has i as a remainder of r divided by p, wherein
each generator polynomial $G_i(X)$ is divisible by $x^{ri}$ but not by $x^{ri+1}$;
each of the code polynomials is represented by $$\sum_{i=0}^{p-1} Q_i(x^{-p}) G_i(x); \text{ and} \tag{10}$$

coefficients of $x_j$ of the code polynomials are information bits, and
the other coefficients of the code polynomials are parity bits,
wherein
j is less than or equal to $r_j$ mod p.

7. The encoding method, wherein a codeword created by reversing the order of information bits of an arbitrary codeword generated by an encoding method of claim 6 is also a codeword.

8. An encoder for encoding a signal having information bits by adding parity bits to the information bits, comprising:
a parity generator for computing the parity bits by quasi-division operations using a polynomial having coefficients as a dividend, at least some of the coefficients being formed by the information bits, and h generator polynomials $G_0(x), \ldots, G_{h-1}(x)$ as divisors, wherein h is an integer greater than or equal to 2; and
an adder for adding the computed parity bits to the information bits to produce an encoded output signal.

9. An encoder for encoding a signal having information bits into a codeword by a linear code, the information bits appearing in the codeword as a part of the codeword, and the linear code being a code in which a codeword resulting from cyclically shifting an arbitrary codeword by p bit positions is also a codeword, comprising:
a parity generator for generating parity bits by executing quasi-division operations using p polynomials $G_0(x), \ldots, G_{p-1}(x)$ as divisors and a polynomial having the information bits as coefficients as a dividend; and
concatenation means for concatenating the parity bits that are generated by the parity generator with the information bits to generate the code polynomial and outputting the encoded signal.

10. The encoder according to claim 9, wherein the parity generator simultaneously receives a plurality of information bits and sequentially generates parity bits corresponding to the information bits.

* * * * *